United States Patent [19]

Schachameyer et al.

[11] Patent Number: 4,655,849
[45] Date of Patent: Apr. 7, 1987

[54] SEMICONDUCTOR PROCESSING TECHNIQUE FOR GENERATING DANGLING SURFACE BONDS AND GROWING EPITAXIAL LAYER BY EXCIMER LASER

[75] Inventors: Steven R. Schachameyer, Whitefish Bay; James A. Benjamin, Waukesha; John B. Pardee, Milwaukee, all of Wis.; Lyle O. Hoppie, Birmingham, Mich.

[73] Assignee: Eaton Corporation, Cleveland, Ohio

[21] Appl. No.: 737,223

[22] Filed: May 22, 1985

[51] Int. Cl.$^4$ ............... H01L 21/265; B05D 5/12
[52] U.S. Cl. ................... 148/1.5; 29/576 B; 29/576 T; 148/187; 148/DIG. 93; 156/635; 427/53.1
[58] Field of Search ............. 148/1.5, 187; 29/576 B, 29/576 T; 427/53.1, 38; 156/635

[56] References Cited

U.S. PATENT DOCUMENTS

| | | | |
|---|---|---|---|
| 4,292,093 | 9/1981 | Ownby et al. | 148/1.5 |
| 4,340,617 | 7/1982 | Deutsch et al. | 427/53.1 |
| 4,370,175 | 1/1983 | Levatter | 148/1.5 |
| 4,430,151 | 2/1984 | Tsurada | 156/626 |
| 4,529,617 | 7/1985 | Chenevas-Paule et al. | 427/53.1 |

OTHER PUBLICATIONS

Deutsch, T. F. in Mat. Res. Soc. Symp. vol. 17 ed: Osgood et al., Elsevier, 1983, p. 225.
Emery et al., ref #33 discussed by applicant, Colorado State Univ., Fort Collins, Colorado, 1983.
Andreatta et al., Appl. Phys. Letts. 40 (1982) 182.
Meunier et al., Appl. Phys. Letts. 43 (1983) 273.
Deutsch et al., Appl. Phys. Letts. 38 (1981) 144.
Hirose et al., J. Vac. Sci. Technol. B-3 (1985) 1445.

Primary Examiner—Upendra Roy
Attorney, Agent, or Firm—Andrus, Sceales, Starke & Sawall

[57] ABSTRACT

A semiconductor processing technique is disclosed for resonantly reacting with a semiconductor wafer substrate and cleaving surface atomic bonds to create dangling bonds. The substrate is irradiated with excimer pulsed ultraviolet laser radiation at a discrete designed wavelength to resonantly photolytically cleave surface bonds and create the dangling bonds. This enhances further processing operations such as single crystalline silicon deposition and enhanced bonding and growth thereof.

13 Claims, 2 Drawing Figures

SEMICONDUCTOR PROCESSING TECHNIQUE FOR GENERATING DANGLING SURFACE BONDS AND GROWING EPITAXIAL LAYER BY EXCIMER LASER

BACKGROUND AND SUMMARY

The present invention provides a semiconductor processing technique for nonthermally cleaving surface atomic bonds of a semiconductor wafer substrate and creating dangling surface bonds. This is desirable for enhancing further processing, for example to enhance deposition or epitaxial growth and bonding of single crystalline silicon on the substrate.

Microelectronic device fabrication technology is increasingly demanding more sophisticated semiconductor processing techniques and material formation with more accurate and reliably controlled material characteristics even down to interatomic bonding and crystalline lattice structure. In conventional thermal processing, bonds are thermally vibrationally broken at an elevated temperature. As sophistication increases, thermal processing suffers increasingly significant disadvantages, including unwanted migration of constituents, and wafer warpage.

DETAILED DESCRIPTION

The present invention provides a semiconductor processing technique for reacting with the surface of a semiconductor wafer substrate 2 in chamber 4. Excimer pulsed ultraviolet laser radiation from laser 6 irradiates substrate 2 and resonantly reacts therewith to resonantly photolytically cleave surface atomic bonds and create dangling surface bonds.

Figure 1:
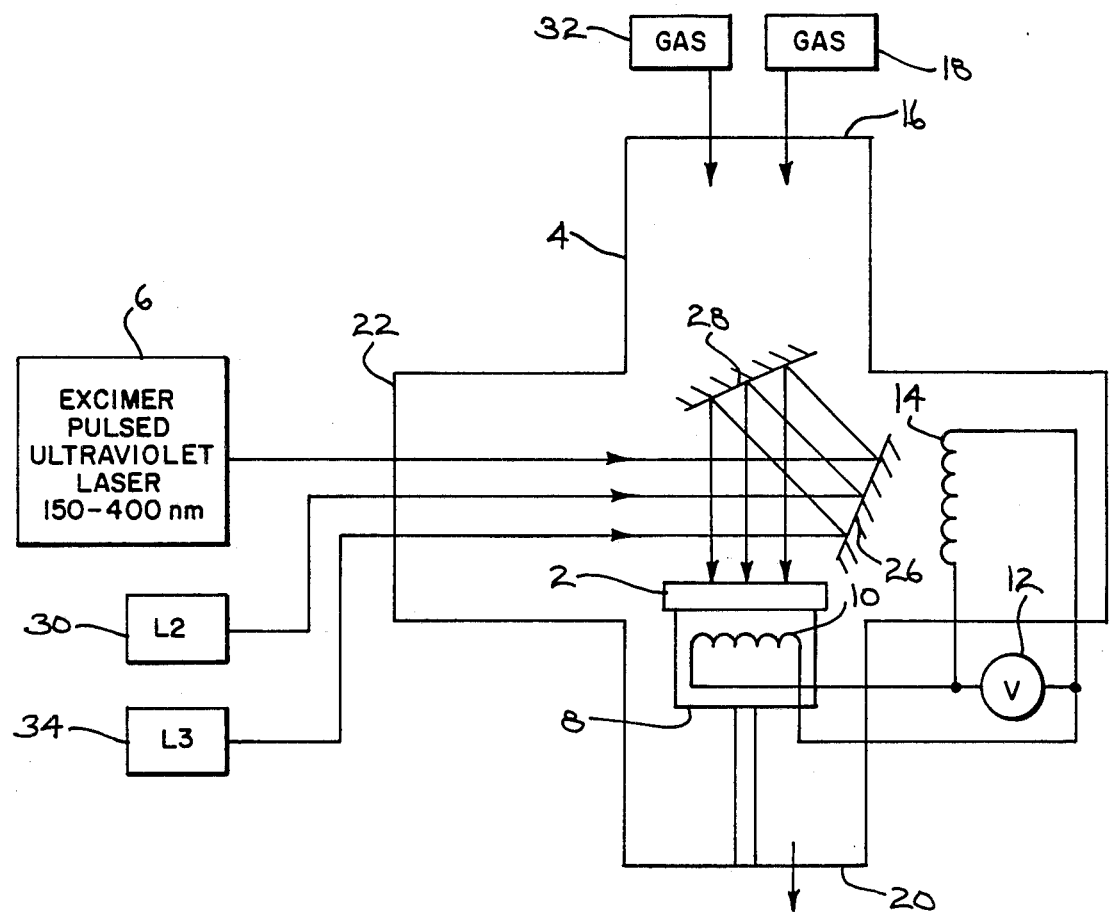
FIG. 1 illustrates the semiconductor processing technique in accordance with the invention.
Figure 2:
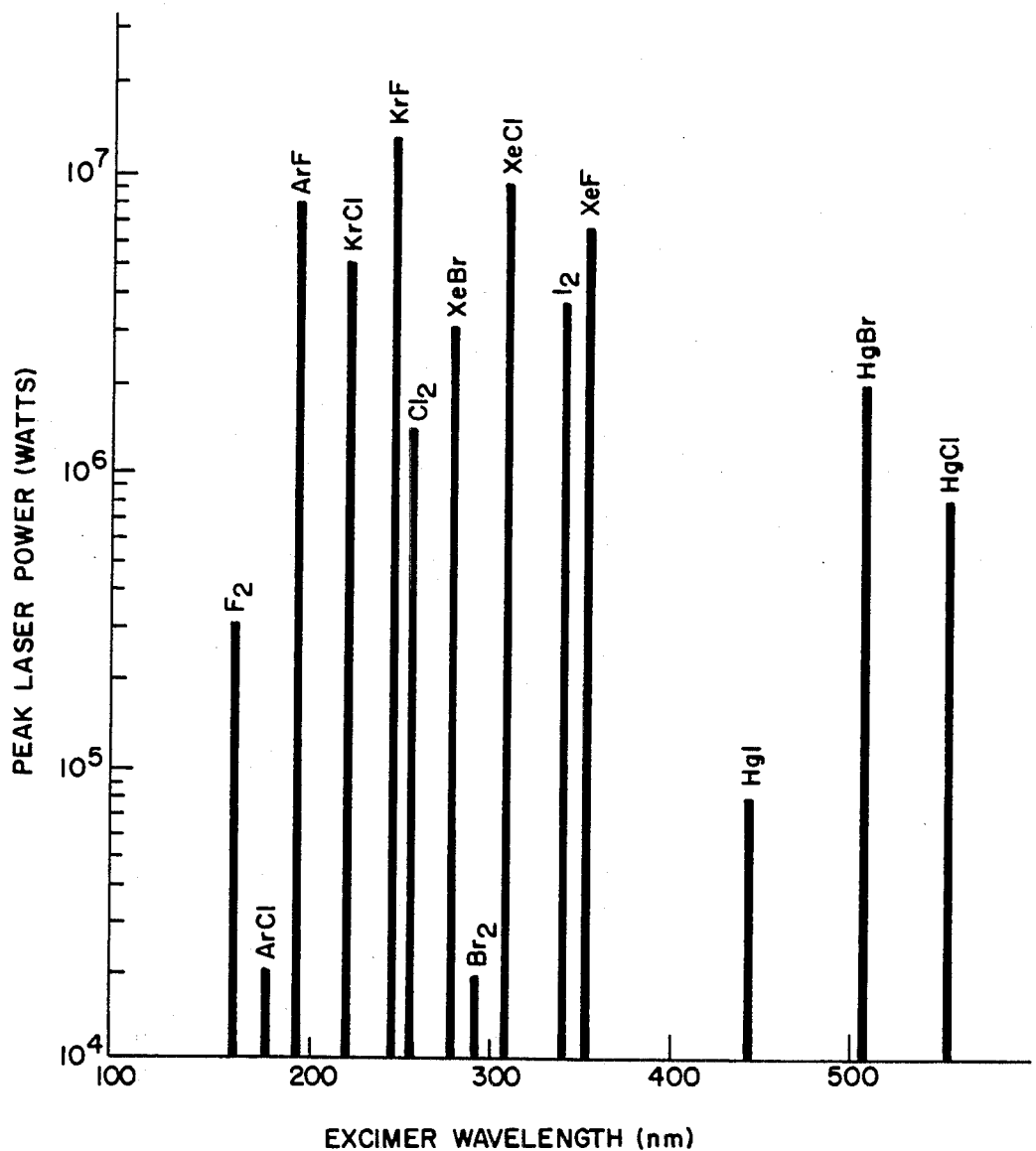
FIG. 2 illustrates various available excimer pulsed ultraviolet radiation wavelengths and peak power.

In the embodiment shown, wafer substrate 2 is silicon or silicon-containing material, such as silicon dioxide, and is placed in a conventional deposition processing chamber 4 having a pedestal 8 for supporting the substrate wafer 2. Conventional processing chambers typically include a resistance coil heater 10 or the like at the pedestal and supplied by a voltage source 12 for heating wafer substrate 2 and/or a resistance coil 14 for heating the interior of chamber 4. These thermal processing elements are optional in the present system. Gas may be introduced into the chamber at port 16 from gas supply 18, and may be exhausted at port 20, all as is conventional. Chamber 4 includes an observation window or port 22. Excimer pulsed ultraviolet laser radiation from laser 6 is introduced through port 22 and is redirected by mirrors 26 and 28 to impinge wafer substrate 2 substantially perpendicularly thereto. FIG. 2 shows various available excimer pulsed ultraviolet laser radiation wavelengths and peak power. At these wavelengths, the surface atomic bonds of substrate 2 are photolytically cleaved to create dangling bonds, without pyrolytic thermal processing. The excimer wavelength is chosen according to the substrate material and its absorption spectrum, or vice versa.

In further forms, silicon-containing gas such as silane $SiH_4$ is introduced from source 18 into chamber 4, and excimer pulsed ultraviolet laser radiation, for example from a second excimer laser source 30, or a second wavelength from laser 6, is introduced into the chamber to photochemically break bonds of the silicon-containing gas at a designated wavelength to epitaxially grow single crystalline silicon on substrate 2, again without thermally driven pyrolytic deposition. The single crystalline silicon is epitaxially deposited at a discrete wavelength of the excimer pulsed ultraviolet laser radiation corresponding to a discrete excitation energy photochemically breaking bonds in the gas providing uniform nucleation and crystallization to single crystalline silicon, with the dangling bonds created by laser 6 significantly enhancing bonding and single crystalline formation and growth. The dangling bond creation and single crystalline deposition are carried out at a temperature ranging from room temperature to about 400° C., which is significantly below typical thermal processing temperatures of 1,000° C. The silicon-containing dopant gas is preferably selected from the group consisting of silane, dislane and silicon alkyl, and the excimer laser radiation is provided up to about 1 joule per pulse and up to about 250 hertz. A buffer gas may be provided in the chamber, with the dopant gas being about 1–10% by volume of the total gas volume.

In a further form, chamber 4 is provided with a gaseous mixture including silicon-containing gas from source 18 and also a scavenger gas from source 32. The scavenger gas is irradiated with excimer pulsed ultraviolet laser radiation, for example from third excimer laser source 34, or another wavelength from laser 6, to photolytically activate the scavenger gas and release scavenging agents to remove surface contaminants from substrate 2, to enable subsequent or concurrent in-situ uniform epitaxial growth of single crystalline silicon across a large continuous area, eliminating growth from separate islands, and further contributing to generation of the noted dangling bonds. The scavenger gas is preferably selected from the group consisting of nitrogen dioxide and carbon tetrafluoride and photolytically reacts with excimer laser radiation from laser 34 to produce scavenging radicals, ions or neutrals. The scavenger gas from source 32 and the siliconcontaining gas from source 18 are preferably benign relative to each other and activated at different excimer pulsed ultraviolet laser radiation wavelengths. It is preferred that three different excimer pulsed ultraviolet laser radiation wavelengths be used, either from three different sources 6, 30 and 34, or from a single source 6, though various alternatives are possible, with dangling bond formation, single crystalline silicon deposition and scavenging all reacting to the same wavelength, or various pairs and combinations. In other alternatives, the laser radiation can react with the scavenger and/or silicon-containing gas without impinging the substrate.

The surface of a semiconductor wafer substrate tends to be planar, uniform and interconnected. In order for subsequent processing techniques to react, it is desirable to increase the surface reactivity and break away various atoms from neighboring units and provide more free bonding sites, for example to react with and absorb new incoming silicon in a further silicon processing step and enhance bonding therewith. In the present invention, the population of dangling bonds in the natural state is increased by resonantly reacting with the substrate either before or during a subsequent deposition step. This resonant reaction is carried out photolytically, without pyrolytic thermal reaction.

The invention also selectively increases the number of nucleation and bonding sites at localized selected portions of the surface, as an alternative to masking. The dangling bonds are created only where one wants to later deposit silicon. The narrow spectral output of the excimer pulsed ultraviolet laser enables highly specific electronic excitation of bonding sites at highly localized areas and excitation energies, driving a predetermined controllable reaction. The laser beam is focused tightly down to a fine spot, for example a micron in width or less, and used to write a line or pattern of dangling bond nucleation sites on the substrate surface, at which sites later deposited silicon will bond and nucleate to match the corresponding pattern, without a mask. The activation of the substrate to selectively enable later silicon absorption thereinto in a designated pattern is a particularly desirable aspect of the invention. The substrate surface is irradiated with excimer pulsed ultraviolet laser radiation at a discrete designated wavelength at selective localized areas resonantly reacting with and activating the substrate to resonantly photolytically cleave surface atomic bonds and create dangling bonds at the selective areas to locally increase surface reactivity by creating more nucleation and bonding sites to strongly couple with and absorb incoming material along the given pattern of selective localization.

It is recognized that various alternatives and modifications are possible within the scope of the appended claims.

We claim:

1. A method for enhancing deposition and bonding of single crystalline silicon on a silicon-containing substrate at temperatures ranging from room temperature to about 400° C., comprising:

providing a chamber capable of receiving silicon-containing gas;

placing a silicon-containing wafer substrate in said chamber;

introducing silicon-containing gas into said chamber; and introducing excimer pulsed ultraviolet laser radiation into said chamber at a first wavelength to resonantly react with said substrate to cleave surface silicon-silicon bonds and create dangling bonds, and at a second wavelength to photochemically break bonds of said gas at a designated wavelength to epitaxially grow single crystalline silicon on said substrate, bonding with said dangling bonds, without thermally driven pyrolytic deposition.

2. The invention according to claim 1 comprising photolytically cleaving said surface silicon-silicon bonds at a discrete said first wavelength of said excimer pulsed ultraviolet laser radiation corresponding to a discrete excitation energy photochemically breaking said surface silicon-silicon bonds, and comprising photolytically depositing said single crystalline silicon at a discrete second said wavelength of said excimer pulsed ultraviolet laser radiation corresponding to a discrete excitation energy photochemically breaking bonds in said gas providing uniform nucleation and crystallization to said single crystalline silicon.

3. The invention according to claim 2 comprising:

providing said gas selected from the group consisting of silane, disilane and silicon alkyl;

providing said excimer pulsed ultraviolet laser radiation up to about 1 joule per pulse at up to about 250 hertz; and providing a buffer gas in said chamber, said first mentioned gas being about 1-10% by volume of the total gas volume.

4. The invention according to claim 2 wherein said first and second wavelengths are different and provided by first and second separate lasers.

5. The invention according to claim 2 wherein said first and second wavelengths are different wavelengths provided by a single laser.

6. The invention according to claim 2 wherein said first and second wavelengths are the same.

7. The invention according to claim 2 comprising further treating said substrate in-situ in said chamber prior to depositing said single crystalline silicon by providing a scavenger gas in said chamber, and irradiating said scavenger gas with excimer pulsed ultraviolet laser radiation to photolytically activate said scavenger gas and release scavenging agents to remove surface contaminants from said substrate, to enable subsequent in-situ uniform epitaxial growth of said single crystalline silicon across a large continuous area, eliminating growth from separate islands.

8. The invention according to claim 7 wherein said scavenger gas is selected from the group consisting of nitrogen dioxide and carbon tetafluoride and photolytically reacts with said excimer pulsed ultraviolet laser radiation to produce scavenging radicals, ions or neutrals.

9. The invention according to claim 7 wherein said scavenger gas and said silicon-containing gas are benign relative to each other and activated at different excimer pulsed ultraviolet laser radiation wavelengths.

10. A semiconductor processing technique for simultaneously removing surface contaminants from a silicon-containing substrate and creating dangling silicon-silicon surface bonds and depositing single crystalline silicon on said substrate in-situ in the same chamber without pyrolytic thermal reaction, comprising:

providing a chamber capable of receiving gas;

placing said substrate in said chamber;

introducing a gaseous mixture into said chamber including silicon-containing gas and scavenger gas; and providing excimer pulsed ultraviolet laser means and introducing radiation therefrom into said chamber to irradiate the surface of said substrate and resonantly react therewith to cleave surface silicon-silicon bonds and create dangling bonds, and to photolytically react with and activate said scavenger gas and release scavenging agents to remove surface contaminants from said substrate to enable in-situ uniform epitaxial growth of single crystalline silicon, and to photolytically react with said silicon-containing gas to photochemically break bonds thereof and photolytically epitaxially deposit single crystalline silicon on said substrate providing uniform nucleation and crystallization to epitaxial single crystal silicon, all at a temperature ranging from room temperature to about 400° C., without pyrolytic thermal processing.

11. The invention according to claim 10 comprising photolytically reacting with said substrate, said scavenger gas and said silicon-containing gas at different discrete wavelengths.

12. A method for maskless pattern formation on a semiconductor wafer substrate comprising irradiating said substrate with excimer pulsed ultraviolet laser radiation at a discrete designated wavelength at selective localized areas of said substrate resonantly reacting with and activating said substrate to resonantly cleave surface atomic bonds and create dangling bonds at said selective areas to locally increase surface reactivity by creating more nucleation and bonding sites, and depositing semiconductor material bonding and nucleating at said nucleation and bonding sites such that said substrate strongly couples with and absorbs said semiconductor material along the pattern of selective localization.

13. The invention according to claim 12 wherein said excimer pulsed ultraviolet laser radiation is focused tightly down to a fine spot less than or equal to about a micron in width and used to write a line or pattern of dangling bond nucleation sites on said substrate, at which sites said deposited semiconductor material bonds and nucleates to match the corresponding pattern.

* * * * *